United States Patent
Yuan et al.

(10) Patent No.: US 8,928,512 B2
(45) Date of Patent: Jan. 6, 2015

(54) DIGITAL TO ANALOG CONVERTER AND METHOD FOR CONTROLLING CURRENT SOURCE ARRAY IN DIGITAL TO ANALOG CONVERTER

(71) Applicant: Huawei Technologies Co., Ltd., Shenzhen, Guangdong (CN)

(72) Inventors: Haiquan Yuan, Shenzhen (CN); Peng Gao, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/142,597

(22) Filed: Dec. 27, 2013

(65) Prior Publication Data

US 2014/0197974 A1 Jul. 17, 2014

(30) Foreign Application Priority Data

Jan. 14, 2013 (CN) .......................... 2013 1 0012963

(51) Int. Cl.
- *H03M 1/66* (2006.01)
- *H03M 1/68* (2006.01)
- *H03M 1/74* (2006.01)

(52) U.S. Cl.
CPC .............. *H03M 1/685* (2013.01); *H03M 1/747* (2013.01)
USPC ............ 341/144; 341/145; 341/153; 341/136

(58) Field of Classification Search
USPC .................................. 341/144, 145, 153, 136
See application file for complete search history.

(56) References Cited

U.S. PATENT DOCUMENTS

| | | | | |
|---|---|---|---|---|
| 5,014,054 A | * | 5/1991 | Oshita et al. | 341/145 |
| 5,568,145 A | | 10/1996 | Reynolds | |
| 6,157,333 A | * | 12/2000 | Louagie et al. | 341/144 |
| 6,496,131 B2 | * | 12/2002 | Yoshinaga | 341/150 |
| 6,954,164 B2 | * | 10/2005 | Lee et al. | 341/144 |
| 7,068,201 B1 | * | 6/2006 | Chou | 341/144 |
| 7,439,894 B2 | * | 10/2008 | Peng et al. | 341/144 |
| 8,232,903 B2 | * | 7/2012 | Hsu et al. | 341/144 |

FOREIGN PATENT DOCUMENTS

CN 201966893 U 9/2011

* cited by examiner

*Primary Examiner* — Linh Nguyen

(74) *Attorney, Agent, or Firm* — Leydig, Voit & Mayer, Ltd.

(57) ABSTRACT

A digital to analog converter and a method for controlling a current source array in a digital to analog converter relate to the field of electronics technologies, and are used to reduce a system error. The digital to analog converter includes: a decoding module, a switch array, and a current source array, where the decoding module is configured to generate a $2^n-1$-bit first temperature code by using high n bits of an input 2n-bit binary digital signal, generate a $2^n-1$-bit second temperature code by using low n bits of the $2^n$-bit binary digital signal, and control, by using the $2^n-1$-bit first temperature code and the $2^n-1$-bit second temperature code, a working sequence of $2^n \times 2^n-1$ unit switches.

8 Claims, 6 Drawing Sheets

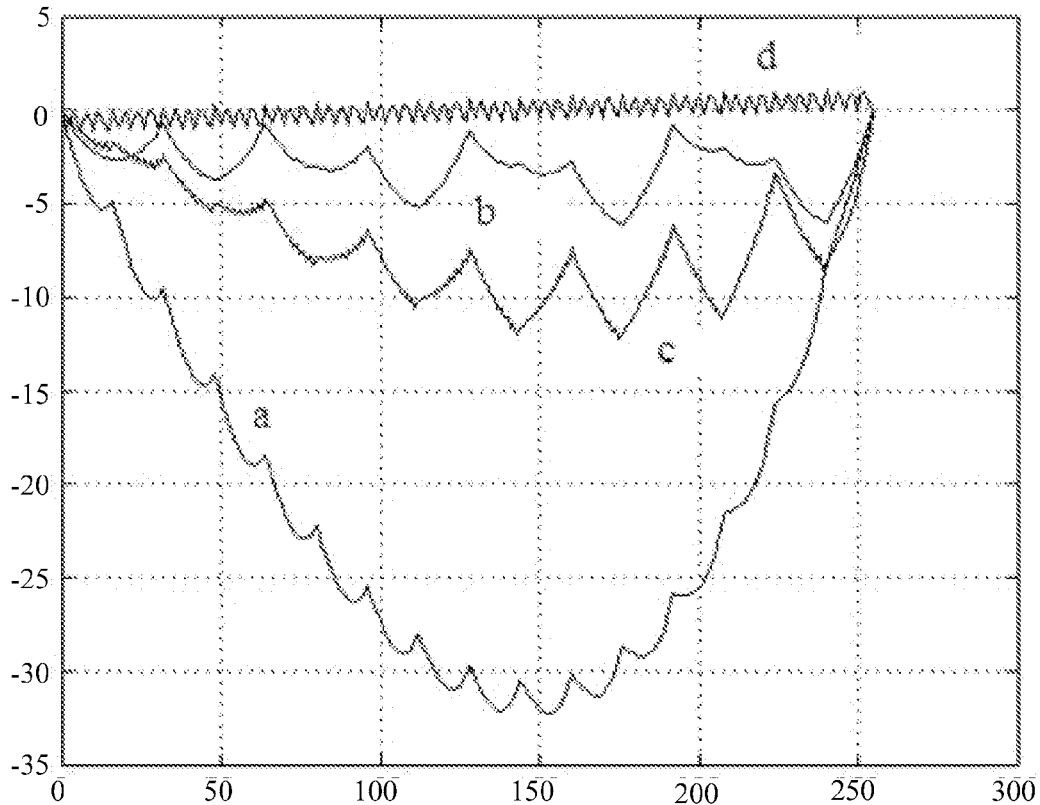

FIG. 6

| Generate a $2^n$-1-bit first temperature code by using high n bits of an input 2n-bit binary digital signal, and generate a $2^n$-1-bit second temperature code by using low n bits of the 2n-bit binary digital signal, where any bit of the $2^n$-1-bit first temperature code is used to control $2^n$ high-order unit switches, and any bit of the $2^n$-1-bit second temperature code is used to control one low-order unit switch | ← 701 |

| Control, by using the $2^n$-1-bit first temperature code and the $2^n$-1-bit second temperature code, a working sequence of the $2^n \times 2^n$-1 unit switches in the following manner: switching all unit switches on any one of $2^n$-1 first diagonals in a $2^n \times 2^n$ matrix formed by the $2^n \times 2^n$-1 unit switches, where all elements on the $2^n$-1 first diagonals correspond to the $2^n \times (2^n$-1) high-order unit switches; and switching all unit switches on a second diagonal except the $2^n$-1 first diagonals in the $2^n \times 2^n$ matrix according to a preset sequence, where $2^n$-1 elements on the second diagonal correspond to the $2^n$-1 low-order unit switches | ← 702 |

FIG. 7

DIGITAL TO ANALOG CONVERTER AND METHOD FOR CONTROLLING CURRENT SOURCE ARRAY IN DIGITAL TO ANALOG CONVERTER

CROSS-REFERENCE TO RELATED APPLICATIONS

This application claims priority to Chinese Patent Application No. 201310012963.9, filed on Jan. 14, 2013, which is hereby incorporated by reference in its entirety.

TECHNICAL FIELD

The present invention relates to the field of electronic technologies, and in particular, to a digital to analog converter and a method for controlling a current source array in a digital to analog converter.

BACKGROUND

Rapid development of a digital signal processing technology results an obvious demand for a high-speed high-precision digital to analog converter (Digital Analog Converter, DAC for short). A high-speed DAC generally is a current source DAC, and a high precision requires good matching between unit current sources. For a specific current source DAC, the prior art has introduced a lot, and a current source DAC has been widely applied to various industrial scenarios. However, for circuit implementation of a DAC, a system error is one of main factors that affect the matching between the unit current sources. System errors mainly include a linear gradient error and a square gradient error. A random error generally can be reduced significantly by increasing the area of a unit current source, but the system error may deteriorate with the increase of the circuit area. The system error can be changed by designing different turn-on sequences for unit current sources in a current source array. In the prior art, solutions for controlling a turn-on sequence of unit current sources in a current source array mainly include: sequential turn-on, symmetrical turn-on, layered symmetrical turn-on, random turn-on, and so on. However, the existing solutions for controlling a turn-on sequence of unit current sources are not ideal for eliminating a system error.

SUMMARY

Embodiments of the present invention provide a digital to analog converter and a method for controlling a current source array in a digital to analog converter, which are used to reduce a system error, thereby improving conversion precision of the digital to analog converter.

In order to achieve the foregoing objective, the following technical solutions are adopted in the embodiments of the present invention:

In a first aspect, a digital to analog converter is provided, including a decoding module, a switch array connected to the decoding module, and a current source array connected to the switch array, where:

the switch array includes $2^n \times 2^n - 1$ unit switches, which include $2^n \times (2^n-1)$ high-order unit switches and $2^n - 1$ low-order unit switches;

the current source array includes $2^n \times 2^n - 1$ unit current sources;

each unit switch is configured to control an output of one unit current source; and outputs of the $2^n \times 2^n - 1$ unit current sources are used to generate an output of the digital to analog converter;

the decoding module is configured to generate a $2^n - 1$-bit first temperature code by using high n bits of an input 2n-bit binary digital signal, and generate a $2^n - 1$-bit second temperature code by using low n bits of the 2n-bit binary digital signal, where any bit of the $2^n - 1$-bit first temperature code is used to control $2^n$ high-order unit switches, and any bit of the $2^n - 1$-bit second temperature code is used to control one low-order unit switch;

the decoding module is further configured to control, by using the $2^n - 1$-bit first temperature code and the $2^n - 1$-bit second temperature code, a working sequence of the $2^n \times 2^n - 1$ unit switches in the following manner:

switching, by using the $2^n - 1$-bit first temperature code, all unit switches on any one of $2^n - 1$ first diagonals in a $2^n \times 2^n$ matrix formed by the $2^n \times 2^n - 1$ unit switches, where all elements on the $2^n - 1$ first diagonals correspond to the $2^n \times (2^n-1)$ high-order unit switches; and switching all unit switches on a second diagonal except the $2^n - 1$ first diagonals in the $2^n \times 2^n$ matrix according to a preset sequence and by using the $2^n - 1$-bit second temperature code, where $2^n - 1$ elements on the second diagonal correspond to the $2^n - 1$ low-order unit switches; and n is a positive integer.

In a first possible implementation, according to the first aspect, the first diagonals are non-middle diagonals, and the second diagonal is a middle diagonal.

In a second possible implementation, according to the first possible implementation, n is greater than or equal to 3, and the switching all unit switches on a second diagonal except the $2^n - 1$ first diagonals in the $2^n \times 2^n$ matrix according to a preset sequence includes:

switching all unit switches on the middle diagonal in ascending order of distances away from two quartering points except the midpoint on the middle diagonal in the $2^n \times 2^n$ matrix, where the two quartering points are $2^{n-2}$ elements away from the midpoint.

In a third possible implementation, according to the second possible implementation, the switching all unit switches on the second diagonal in ascending order of distances away from two quartering points except the midpoint on the second diagonal in the $2^n \times 2^n$ matrix includes:

firstly switching a unit switch which is a first distance away from one quartering point of the two quartering points, and then symmetrically switching a unit switch which is the first distance away from the other quartering point of the two quartering points.

In a fourth possible implementation, with reference to the first aspect or any of the first possible implementation to the third possible implementation, the decoding module includes:

a first decoder, configured to decode the high n bits of the 2n-bit binary digital signal to obtain the $2^n - 1$-bit first temperature code;

a second decoder, configured to decode the low n bits of the 2n-bit binary digital signal to obtain the $2^n - 1$-bit second temperature code; and a control module, configured to control, by using the $2^n - 1$-bit first temperature ode and the $2^n - 1$-bit second temperature code, the working sequence of the $2^n \times 2^n - 1$ unit switches in the manner.

In a fifth possible implementation, according to the fourth possible implementation, the control module is specifically configured to control, under the control of a software driver and by using the $2^n - 1$-bit first temperature code and the $2^n - 1$-bit second temperature code, the working sequence of the $2^n \times 2^n - 1$ unit switches in the manner.

In a second aspect, a method for controlling a current source array in a digital to analog converter is provided, where the digital to analog converter includes a switch array and a current source array connected to the switch array; the switch array includes $2^n \times 2^n - 1$ unit switches, which include $2^n \times (2^n - 1)$ high-order unit switches and $2^n - 1$ low-order unit switches; the current source array includes $2^n \times 2^n - 1$ unit current sources; each unit switch is configured to control an output of one unit current source; outputs of the $2^n \times 2^n - 1$ unit current sources are used to generate an output of the digital to analog converter; n is a positive integer; and the method includes:

generating a $2^n - 1$-bit first temperature code by using high n bits of an input 2n-bit binary digital signal, and generating a $2^n - 1$-bit second temperature code by using low n bits of the 2n-bit binary digital signal, where any bit of the $2^n - 1$-bit first temperature code is used to control $2^n$ high-order unit switches, and any bit of the $2^n - 1$-bit second temperature code is used to control one low-order unit switch; and controlling, by using the $2^n - 1$-bit first temperature code and the $2^n - 1$-bit second temperature code, a working sequence of the $2^n \times 2^n - 1$ unit switches in the following manner: switching, by using the $2^n - 1$-bit first temperature code, all unit switches on any one of $2^n - 1$ first diagonals in a $2^n \times 2^n$ matrix formed by the $2^n \times 2^n - 1$ unit switches, where all elements on the $2^n - 1$ first diagonals correspond to the $2^n \times (2^n - 1)$ high-order unit switches; and switching all unit switches on a second diagonal except the $2^n - 1$ first diagonals in the $2^n \times 2^n$ matrix according to a preset sequence and by using the $2^n - 1$-bit second temperature code, where $2^n - 1$ elements on the second diagonal correspond to the $2^n - 1$ low-order unit switches.

In a first possible implementation, according to the second aspect, the first diagonals are non-middle diagonals, and the second diagonal is a middle diagonal.

In a second possible implementation, according to the first possible implementation, n is greater than or equal to 3, and the switching all unit switches on a second diagonal except the $2^n - 1$ first diagonals in the $2^n \times 2^n$ matrix according to a preset sequence includes:

switching all unit switches on the middle diagonal in ascending order of distances away from two quartering points except the midpoint on the middle diagonal in the $2^n \times 2^n$ matrix, where the two quartering points are $2^{n-2}$ elements away from the midpoint.

In a third possible implementation, according to the second possible implementation, the switching all unit switches on the second diagonal in ascending order of distances away from two quartering points except the midpoint on the second diagonal in the $2^n \times 2^n$ matrix includes:

firstly switching a unit switch which is a first distance away from one quartering point of the two quartering points, and then symmetrically switching a unit switch which is the first distance away from the other quartering point of the two quartering points.

In a third aspect, a method for controlling a current source array in a digital to analog converter is provided, used to control outputs of unit current sources included in the current source array, where the current source array includes $2^n \times 2^n - 1$ unit current sources, n is a positive integer, and the method includes:

generating a $2^n - 1$-bit first temperature code by using high n bits of an input 2n-bit binary digital signal, and generating a $2^n - 1$-bit second temperature code by using low n bits of the 2n-bit binary digital signal, where any bit of the $2^n - 1$-bit first temperature code is used to control $2^n$ high-order unit switches, and any bit of the $2^n - 1$-bit second temperature code is used to control one low-order unit switch;

switching, by using the $2^n - 1$-bit first temperature code, all unit switches on any one of $2^n - 1$ first diagonals in a $2^n \times 2^n$ matrix formed by the $2^n \times 2^n - 1$ unit switches, where all elements on the $2^n - 1$ first diagonals correspond to the $2^n \times (2^n - 1)$ high-order unit switches, so as to control outputs of unit current sources corresponding to the $2^n \times (2^n - 1)$ high-order unit switches in the current source array; and switching all unit switches on a second diagonal except the $2^n - 1$ first diagonals in the $2^n \times 2^n$ matrix according to a preset sequence and by using the $2^n - 1$-bit second temperature code, where $2^n - 1$ elements on the second diagonal correspond to the $2^n - 1$ low-order unit switches, so as to control outputs of unit current sources corresponding to the $2^n - 1$ low-order unit switches in the current source array.

In a first possible implementation, according to the third aspect, the first diagonals are non-middle diagonals, and the second diagonal is a middle diagonal.

In a second possible implementation, according to the first possible implementation, n is greater than or equal to 3, and the switching all unit switches on a second diagonal except the $2^n - 1$ first diagonals in the $2^n \times 2^n$ matrix according to a preset sequence and by using the $2^n - 1$-bit second temperature code includes: switching all unit switches on the middle diagonal in ascending order of distances away from two quartering points except the midpoint on the middle diagonal in the $2^n \times 2^n$ matrix by using the $2^n - 1$-bit second temperature code, where the two quartering points are $2^{n-2}$ elements away from the midpoint.

In a second possible implementation, the following possibility exists: firstly switching a unit switch which is a first distance away from one quartering point of the two quartering points, and then symmetrically switching a unit switch which is the first distance away from the other quartering point of the two quartering points.

According to the digital to analog converter and the method for controlling a current source array in a digital to analog converter that are provided in the embodiments of the present invention, any bit of a $2^n - 1$-bit first temperature code generated by using high n bits of an input 2n-bit binary digital signal is used to control and switch unit switches of all unit current sources on any one of $2^n - 1$ first diagonals, and any bit of a $2^n - 1$-bit second temperature code generated by using low n bits of the 2n-bit binary digital signal input into the digital to analog converter is used to control and switch a unit switch of any unit current source on the remaining second diagonal, so that control over a current source array in the digital to analog converter is implemented and a system error caused by the unit current sources controlled by the high n bits is reduced, thereby improving conversion precision of the digital to analog converter and solving a problem in the prior art that conversion precision of a digital to analog converter is not high because of a system error.

BRIEF DESCRIPTION OF DRAWINGS

To illustrate the technical solutions in the embodiments of the present invention more clearly, the following briefly introduces the accompanying drawings required for describing the embodiments. Apparently, the accompanying drawings in the following description show merely some embodiments of the present invention, and persons of ordinary skill in the art may still derive other drawings from these accompanying drawings without creative efforts.

FIG. 6 is a contrastive diagram of system errors caused by different control methods when a unit error changes, according to an embodiment of the present invention; and FIG. 7 is a flowchart of a method for controlling a current source array in a digital to analog converter according to an embodiment of the present invention.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Figure 1:
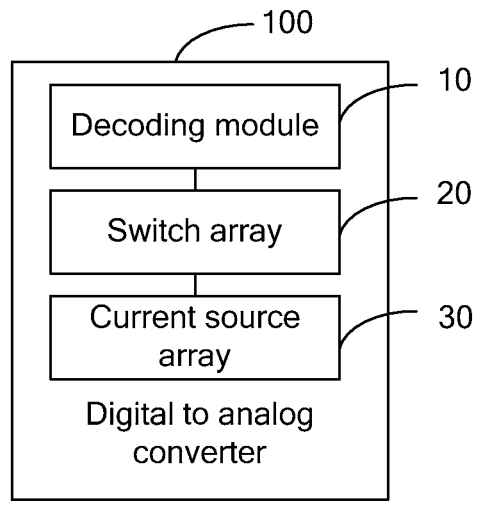
FIG. 1 is a structural diagram of a digital to analog converter according to an embodiment of the present invention.

In one aspect, refer to FIG. 1, which shows a digital to analog converter 100 according to an embodiment of the present invention, where the digital to analog converter 100 includes a decoding module 10, a switch array 20 connected to the decoding module 10, and a current source array 30 connected to the switch array 20.

The switch array 20 includes $2^n \times 2^n - 1$ unit switches, which include $2^n \times (2^n - 1)$ high-order unit switches and $2^n - 1$ low-order unit switches.

The current source array 30 includes $2^n \times 2^n - 1$ unit current sources.

Each unit switch is configured to control an output of one unit current source; and outputs of the $2^n \times 2^n - 1$ unit current sources are used to generate an output of the digital to analog converter.

The decoding module 10 is configured to generate a $2^n - 1$-bit first temperature code by using high n bits of an input 2n-bit binary digital signal, and generate a $2^n - 1$-bit second temperature code by using low n bits of the 2n-bit binary digital signal, where any bit of the $2^n - 1$-bit first temperature code is used to control $2^n$ high-order unit switches, and any bit of the $2^n - 1$-bit second temperature code is used to control one low-order unit switch;

Exemplarily, for conversion of a 2n-bit binary digital signal, a maximum numerical value after the conversion is $2^n \times 2^n - 1$. Therefore, in this embodiment of the present invention, at least $2^n \times 2^n - 1$ unit current sources are arranged in the digital to analog converter 100, and $2^n \times 2^n - 1$ unit switches are arranged correspondingly, so as to control all unit current sources correspondingly in a one-to-one manner. Certainly, $2^n \times 2^n$ unit current sources and $2^n \times 2^n$ unit switches may also be arranged. That is to say, both the switch array 20 and the current source array 30 may be a $2^n \times 2^n$ matrix with one element missing, and may be a matrix including $2^n \times 2^n$ elements.

The decoding module 10 is further configured to control, by using the $2^n - 1$-bit first temperature code and the $2^n - 1$-bit second temperature code, a working sequence of the $2^n \times 2^n - 1$ unit switches in the following manner:

switching all unit switches on any one of $2^n - 1$ first diagonals in a $2^n \times 2^n$ matrix formed by the $2^n \times 2^n - 1$ unit switches, where all elements on the $2^n - 1$ first diagonals correspond to the $2^n \times (2^n - 1)$ high-order unit switches; and switching all unit switches on a second diagonal except the $2^n - 1$ first diagonals in the $2^n \times 2^n$ matrix according to a preset sequence, where $2^n - 1$ elements on the second diagonal correspond to the $2^n - 1$ low-order unit switches;

where, n is a positive integer.

Further, the decoding module 10 may include:

a first decoder, configured to decode the high n bits of the 2n-bit binary digital signal to obtain the $2^n - 1$-bit first temperature code;

a second decoder, configured to decode the low n bits of the 2n-bit binary digital signal to obtain the $2^n - 1$-bit second temperature code; and a control module, configured to control, by using the $2^n - 1$-bit first temperature code and the $2^n - 1$-bit second temperature code, the working sequence of the $2^n \times 2^n - 1$ unit switches in the manner.

The control module may control, under the control of a software driver and by using the $2^n - 1$-bit first temperature code and the $2^n - 1$-bit second temperature code, the working sequence of the $2^n \times 2^n - 1$ unit switches in the manner. Code of the software driver may be stored in a memory, and the control module may read the code in the memory to execute the software driver.

The following introduces the meaning of a diagonal in this embodiment of the present invention: for a $2^n \times 2^n$ matrix, it includes $2^n$ diagonals and specifically includes a middle diagonal and $2^n - 1$ non-middle diagonals, where the middle diagonal and the non-middle diagonals are parallel to each other. The so-called middle diagonal may refer to a principal diagonal from the upper left to the lower right, or may refer to a secondary diagonal from the upper right to the lower left. The meaning of a non-middle diagonal is to be described in detail in the following by using a middle diagonal serving as a principal diagonal as an example. For a specific matrix form, reference may be made to FIG. 3(A).

Diagonals that are parallel to the principal diagonal and located on the upper right of the principal diagonal are successively called oblique line 1, oblique line 2, ..., oblique line i, ..., in ascending order, and diagonals that are located on the lower left of the principal diagonal are successively called oblique line (n−1)', oblique line (n−2)', ..., oblique line i', ..., in descending order. A combination of any oblique line i and oblique line i' is called a non-middle diagonal parallel to the principal diagonal. The number of elements passed through by two oblique lines which form the non-middle diagonal is the same as that of the principal diagonal. That is to say, the number of elements in the matrix that are passed through by any one of the diagonals is the same.

If the current source array 30 is a $2^n \times 2^n$ matrix including $2^n \times 2^n$ elements, both the first diagonal and the second diagonal are any one of the foregoing diagonals, and each diagonal includes $2^n$ elements, where there are $2^n-1$ first diagonals and one second diagonal. In this embodiment of the present invention, because only $2^n \times 2^n - 1$ unit current sources function in the current source array 30, there will inevitably be one unit current source that does not function. Preferably, this unit current source that does not function is located on the second diagonal. Further, preferably, this unit current source that does not function is located at one of two ends of the second diagonal.

If the current source array 30 is a $2^n \times 2^n$ matrix including $2^n \times 2^n - 1$ elements, the first diagonal is a diagonal that is among the foregoing diagonals and includes $2^n$ elements, and the second diagonal is a diagonal that is among the foregoing diagonals and includes $2^n - 1$ elements. Preferably, the element missing from the $2^n \times 2^n$ matrix including $2^n \times 2^n - 1$ elements is located at one of two ends of the second diagonal.

The first diagonal and the second diagonal may also be defined by using the secondary diagonal of the $2^n \times 2^n$ matrix as a reference standard. A defining method is similar to the above, which is not described herein again.

Exemplarily, each unit switch is configured to control an output of one unit current source, and the switch array 20 is configured to guide outputs of currents of unit current sources on the first diagonals under the control of the first temperature code, and guide outputs of currents of unit current sources on the second diagonal under the control of the second temperature code. How multiple power sources of a current source DAC output and generate an output result of the DAC belongs to the prior art and is not described in detail in this embodiment.

A unit switch may be a single-pole single-throw switch or a single-pole double-throw switch. When the unit switch is a single-pole single-throw switch, the switch array 20 may control guidance of outputs of currents of all unit current sources of the current source array 30 and use the sum of the currents of all unit current sources as an output of the digital to analog converter 100. When the unit switch is a single-pole double-throw switch, the switch array 20 may separately guide the currents output by the current source array 30 to a positive output terminal or a negative output terminal of the digital to analog converter. Either output terminal of the two output terminals may be used as the output of the digital to analog converter 100, or a difference between the two output terminals may be used as the output of the digital to analog converter 100. Certainly, the unit switch may include another type, and the output of the digital to analog converter 100 may also be implemented by using another method, which is not limited in this embodiment.

Figure 2:
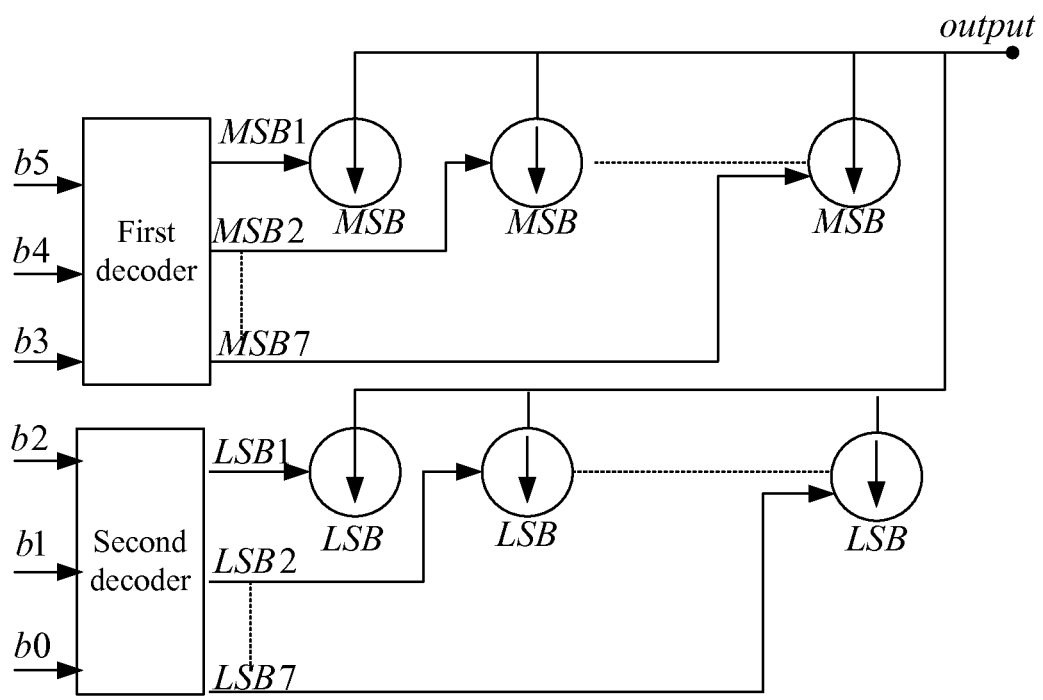
FIG. 2 is a schematic structural diagram of a digital to analog converter according to an embodiment of the present invention.

Optionally, refer to FIG. 2, which is a schematic structural diagram of the digital to analog converter 100 when the unit switch is a single-pole single-throw switch.

A digital electrical signal input into the digital to analog converter 100 is a 6-bit binary digital signal, low 3 bits of the 6-bit binary digital signal are marked as b0, b1, and b2, and high 3 bits are marked as b3, b4, and b5. In FIG. 2, decoders mentioned in this embodiment include two parts, a first decoder and a second decoder. The actual quantity of decoders can be configured flexibly, and the decoders may be implemented by any one or more decoder devices.

The first decoder generates a 7-bit first temperature code by using the high 3 bits, where each bit of the 7-bit first temperature code is marked as MSB1, MSB2, . . . , and MSB7, and each bit of the 7-bit first temperature code controls and switches unit switches of eight unit current sources on a first diagonal, so as to control the eight unit current sources. Eight unit current sources on each first diagonal are marked as an MSB, which is actually composed of eight unit current sources (each marked as an LSB). The second decoder generates a 7-bit second temperature code by using the low 3 bits, where each bit of the 7-bit second temperature code is marked as LSB1, LSB2, . . . , and LSB7, each bit of the 7-bit second temperature code controls and switches a unit switch of one unit current source on the second diagonal, and the unit current source on the second diagonal is marked as an LSB (unit current source). For a specific control process, reference may be made to the following embodiment.

The sum of the currents of all the unit current sources may be used as the output of the digital to analog converter 100, and the current is output through an output port (output).

A process in which the temperature codes control the unit switches of the unit current sources in the current source array is described in detail in the following. Each bit of the temperature code has two states, 1 and 0, so as to control a switch corresponding to a unit current source, where the switch may be an MOS (metal-oxide semiconductor) switch. For example, the temperature code 1 may indicate that the switch is on and 0 indicates that the switch is off, and vice versa. The digital electrical signal input into the digital to analog converter 100 is a 6-bit binary digital signal for description.

As can be seen from the digital electrical signal that is input into the digital to analog converter 100 and is a 6-bit binary digital signal, the current source array 30 is an 8×8 matrix including 63 elements. That is, the number of unit current sources is 63; the number of first diagonals is 7, and the number of unit current sources on each first diagonal is 8; the number of second diagonals is 1, and the number of unit current sources on the second diagonal is 7; and the number of unit switches in the switch array is 63.

For example, a 7-bit temperature code is represented as:

| 0 | 0 | 1 | 0 | 1 | 1 | 0 |
|---|---|---|---|---|---|---|

The bits of the 7-bit temperature code are identified as bit 0 to bit 6 from right to left, and it can be known that bits 1, 2, and 4 of the 7-bit temperature code are in the state "1" and that bits 0, 3, 5, and 6 are in the state "0".

When the 7-bit temperature code represents the first temperature code, bits 1, 2, and 4 may be used to control and switch unit switches of unit current sources on any three of the first diagonals in the current source array 30, so as to guide the currents of the unit current sources on the three first diagonals to an output terminal; and bits 0, 3, 5, and 6 may be used to control and switch on-off of unit switches of unit current sources on the remaining 4 first diagonals in the current source array 30. In this case, the currents of the current sources are not guided to the output terminal.

When the 7-bit temperature code represents the second temperature code, bits 1, 2, and 4 may be used to control and switch unit switches of any three unit current sources on the second diagonal in the current source array 30, so as to guide the currents of the three unit current sources to an output terminal; and bits 0, 3, 5, and 6 may be used to control and switch on-off of unit switches of the four remaining unit current sources on the second diagonal of the current source array 30.

Further, in order to make the control process simple and clear and to make conversion precision of the digital to analog converter 100 higher, preferably, that any bit of the $2^n-1$-bit first temperature code is used to control and switch unit switches of all unit current sources on any one of the $2^n-1$ first diagonals may include that the $2^n-1$-bit first temperature code is used to control and switch unit switches of all unit current sources on the $2^n-1$ first diagonals correspondingly in a one-to-one manner.

Exemplarily, when a digital electrical signal input into the digital to analog converter 100 is a 6-bit binary digital signal, the first diagonal is a combination of oblique line i and oblique line i' (i=1, 2, ..., 7). It may be set that bit 0 of the 7-bit first temperature code is used to control and switch unit switches of eight unit current sources on the combination of oblique line 1 and oblique line 1', that bit 1 is used to control and switch unit switches of eight unit current sources on the combination of oblique line 2 and oblique line 2', ..., and that bit 6 is used to control and switch unit switches of eight unit current sources on the combination of oblique line 7 and oblique line 7'. Then, when bits 1, 2, and 4 of the 7-bit first temperature code are in the state "1", bit 7 of the first temperature code can be used to control and switch unit switches of unit current sources on the three first diagonals of the combination of oblique line 2 and oblique line 2', the combination of oblique line 3 and oblique line 3', and the combination of oblique line 5 and oblique line 5'.

Further, in order to reduce a system error of the digital to analog converter 100 and improve the conversion precision, preferably, the first diagonals are non-middle diagonals, and the second diagonal is a middle diagonal.

When n is greater than or equal to 3, the switching all the unit switches on a second diagonal except the $2^n-1$ first diagonals in the $2^n \times 2^n$ matrix according to a preset sequence may include:

switching all unit switches on the middle diagonal in ascending order of distances away from two quartering points except the midpoint on the middle diagonal in the $2^n \times 2^n$ matrix, where the two quartering points are $2^{n-2}$ elements away from the midpoint.

Exemplarily, the middle diagonal may be a principal diagonal or a secondary diagonal. In this embodiment, the middle diagonal is selected as a principal diagonal for description.

Further, preferably, the switching all unit switches on the second diagonal in ascending order of distances away from two quartering points except the midpoint on the second diagonal in the $2^n \times 2^n$ matrix includes:

firstly switching a unit switch which is a first distance away from one quartering point of the two quartering points, and then symmetrically switching a unit switch which is the first distance away from the other quartering point of the two quartering points.

The following describes in detail that the system error can be reduced by adopting the foregoing preferred method when the principal diagonal serves as the second diagonal.

1. Relative Error Model of Unit Current Sources in the Current Source Array

Each unit current source in a current source array on a chip has a certain error because of processing craft differences, temperatures, stresses, and the like. When a horizontal coordinate axis x and a vertical coordinate axis y are given, the error of the coordinate midpoint is assumed to be 0, and then an error of each unit current source relative to the midpoint in the range of the x-y coordinate axes may be recorded as:

$$\epsilon(x,y) = a_0 + a_{11} \cdot x + a_{12} \cdot y + a_{21} \cdot x^2 + a_{22} \cdot y^2 + a_{23} xy + a_{31} x^3 + \quad (1)$$

$\epsilon(x, y)$ indicates an error of a unit current source with center coordinates (x, y) relative to the midpoint, $a_0$, $a_{11}$, ... are coefficients of different items. Generally, a first-degree item and a square item can accurately express the relative error, and a high-order item can be ignored. That is, the relative error may be recorded as: $\epsilon_{total} = \epsilon_l + \epsilon_q$, where $\epsilon_{total}$ indicates the error of the unit current source with center coordinates (x, y) relative to the midpoint after the high-order item is ignored, $\epsilon_l$ indicates a linear gradient error which may be represented as $\epsilon_l = a_{11} \cdot x + a_{12} \cdot y$, and $\epsilon_q$ is a square gradient error which may be represented as $\epsilon_q = a_{21} \cdot x^2 + a_{22} \cdot y^2$.

A more general expression is in which it is $$\begin{aligned} \varepsilon_l(x, y) &= \varepsilon \cdot \cos\theta \cdot x + \varepsilon \cdot \sin\theta \cdot y \\ \varepsilon_q(x, y) &= k \cdot (x^2 + y^2) + C \end{aligned} \quad (2)$$

assumed that the square gradient error has a same relative error in directions of the x axis and the y axis, where $\epsilon_l(x, y)$ indicates a linear gradient error of the unit current source with center coordinates (x, y) relative to the midpoint, $\epsilon_q(x, y)$ indicates a square gradient error of the unit current source with center coordinates (x, y) relative to the midpoint, $\epsilon$ is a slope of a linear relative error, $\theta$ is a gradient angle of the linear relative error, C is a constant value, and k is a constant, and the square gradient error and the linear gradient error are mutually independent.

2. Relative Error of Each Unit Current Source in the Current Source Array after the Coordinates are Established Refer to the layout of the current source array in FIG. 3(A) and FIG. 3(B). The current source array may be regarded as an 8×8 matrix, the unit current sources may be regarded as elements of the 8×8 matrix, and a space occupied by each element (that is, each unit current source) is called a unit block, where no unit current source is arranged in the unit block of row 8 column 8. The center of the current source array is the midpoint of the coordinates, and the relative error of the midpoint is assumed to be 0.

Figure 3A:
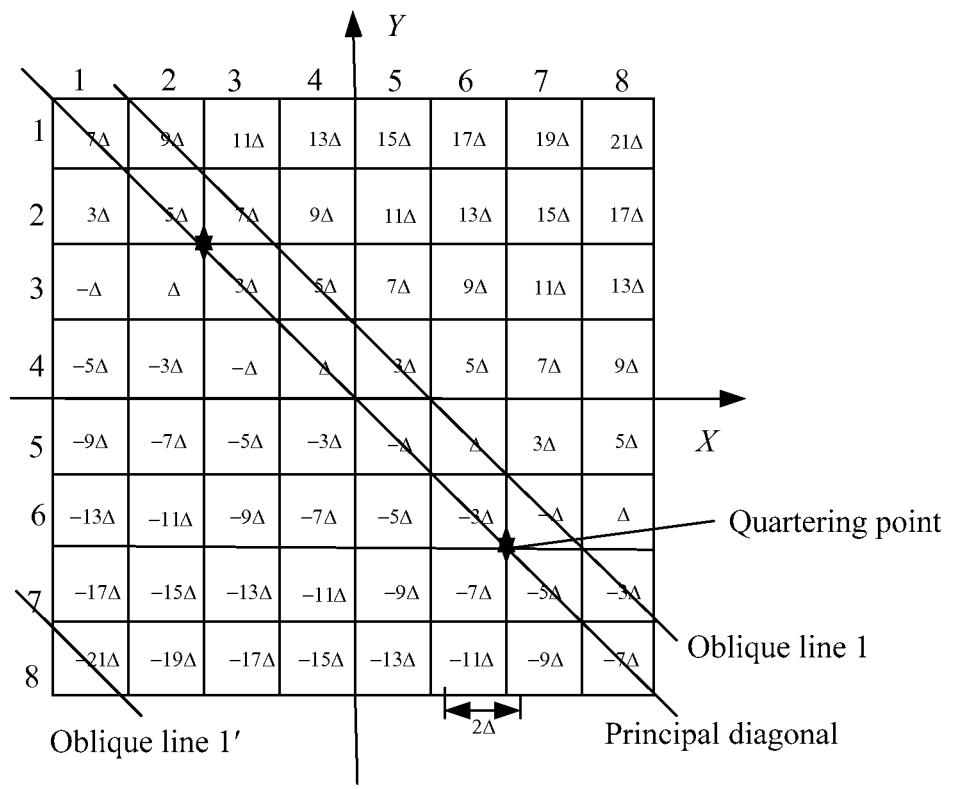
FIG. 3(A) illustrates linear gradient errors of unit current sources in a current source array controlled by a 6-bit binary digital signal, according to an embodiment of the present invention.

Refer to FIG. 3(A), in which a linear gradient error of each unit current source relative to the midpoint is illustrated. A unit error of each unit current source in the direction of the x axis relative to the midpoint is $\epsilon \cdot \cos\theta = \Delta$, and a unit error in the direction of y axis relative to the midpoint is $\epsilon \cdot \sin\theta = 2\Delta$.

A process for calculating a linear gradient error of a unit current source is as follows: the unit current source on the unit block of row 4 column 5 is used as an example, coordinates of the center of the unit block are (1, 1), and therefore the relative error of the unit current source of the unit block is $\Delta + 2\Delta = 3\Delta$.

Figure 3B:
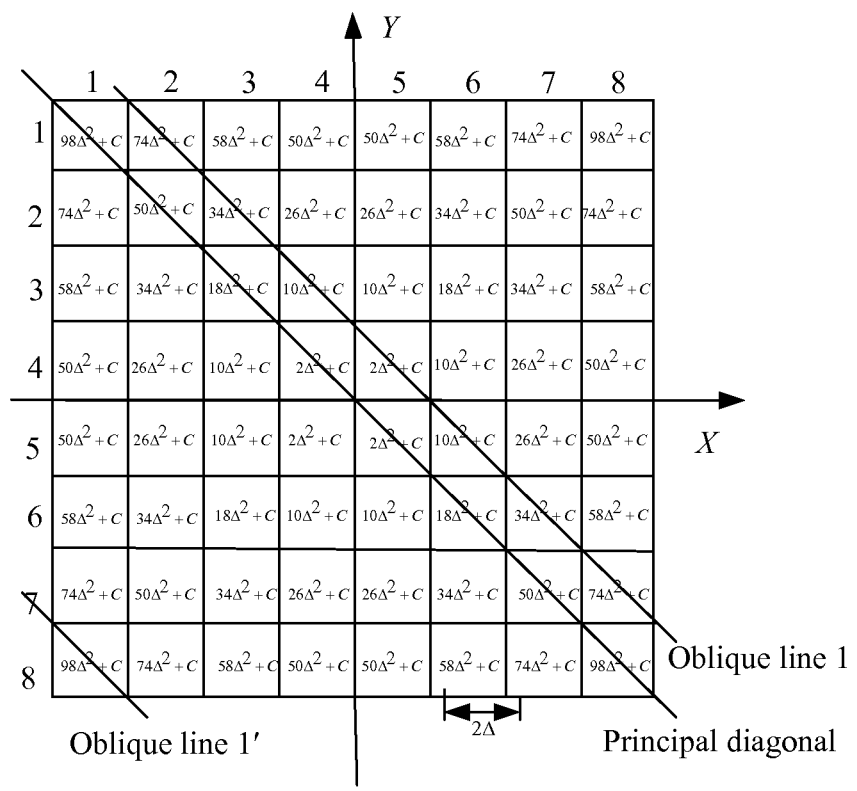
FIG. 3(B) illustrates square gradient errors of unit current sources in a current source array controlled by a 6-bit binary digital signal, according to an embodiment of the present invention.

Refer to FIG. 3(B), in which a square gradient error of each unit current source relative to the midpoint is illustrated. FIG. 3(B) may be obtained according to FIG. 3(A) and $\epsilon_q(x, y) = k \cdot (x^2+y^2)+C$ in the formula (2).

A process for calculating a square gradient error of a unit current source is as follows: the unit current source on the unit block of row 4 column 5 is used as an example, coordinates of the center of the unit block are (1, 1), and $\Delta x = \Delta y = \Delta$ is assumed for a square gradient error, and therefore, the relative error of the unit current source of the unit block is $(\Delta x)^2 + (\Delta y)^2 + C = 2\Delta^2 + C$. Since the mean value of relative errors is zero, it can be known that $C = -42\Delta^2$ for a square error.

3. System Error of the Digital to Analog Converter 100

Reducing the system error of the digital to analog converter 100 is essentially reducing an accumulation of system errors of the digital to analog converter 100, so as to ensure linearity of the DAC.

(1) The first temperature code controls and switches unit switches of all current sources on the first diagonals.

Refer to FIG. 3(A) and FIG. 3(B). When the principal diagonal serves as the second diagonal, a first diagonal is a combination of oblique line i and oblique line i' (i=1, 2, ..., 7). The combination of oblique line 1 and oblique line 1' serving as the first diagonal is used as an example, the sum of errors of the eight unit current sources on the first diagonal is: $\epsilon_{total} = \epsilon_l + \epsilon_q = (9+7+5+3+1-1-3-21)\Delta + (36\Delta^2 + 8C) = 0$. It can be known through calculation that the sum of linear gradient errors and the sum of square gradient errors of the eight unit current sources on any one of other first diagonals are both zero. That is, any bit of the first temperature code controls and switches the unit switches of all unit current sources on any one of the first diagonals, which enables the system error of the digital to analog converter 100 to be 0.

(2) The second temperature code controls and switches a unit switch of a current source on the second diagonal according to a preset sequence (which is equivalent to a sequence in ascending order of distances away from the two quartering points except the midpoint on the middle diagonal).

Exemplarily, referring to FIG. 3(A) and FIG. 3(B), it is assumed that the second diagonal is the principal diagonal, and the eight unit current sources on the principal diagonal may be divided into two categories according to their distances away from the two quartering points except the midpoint on the principal diagonal. The first category includes $a_{33}$, $a_{22}$, $a_{77}$, and $a_{66}$, and the second category includes $a_{44}$, $a_{11}$, $a_{55}$, and $a_{88}$, where $a_{ii}$ indicates a unit current source on a unit block of row i column i in the 8×8 matrix. The distances from any unit current source in either category to the two quartering points except the midpoint on the principal diagonal are equal, and distances from unit current sources in the first category to the two quartering points except the midpoint on the principal diagonal are shorter than distances from unit current sources in the second category to the two quartering points except the midpoint on the principal diagonal. For example, when the number of bits with the state "1" in the 7-bit second temperature code is 1, the 7-bit second temperature code controls and switches a unit switch of any one of the unit current sources $a_{33}$, $a_{22}$, $a_{77}$, and $a_{66}$; and when the number of bits with the state "1" in the 7-bit second temperature code is 3, the 7-bit second temperature code controls and switches unit switches of any three of the unit current sources $a_{33}$, $a_{22}$, $a_{77}$, and $a_{66}$.

For a switch of a unit current source which is a first distance away from both the quartering points except the midpoint, restraining both the accumulation of linear gradient errors and the accumulation of square gradient errors is considered. Preferably, the preset switching sequence may include: firstly switching a unit switch of a unit current source which is the first distance away from one of the two quartering points except the midpoint, and then symmetrically switching a unit switch of a unit current source which is the first distance away from the other of the two quartering points.

Exemplarily, for the four unit current sources in the first category, the preset sequence may be $a_{33}$, $a_{22}$, $a_{77}$, and $a_{66}$. For example, when the number of bits with the state "1" in the 7-bit second temperature code is 1, the 7-bit second temperature code controls and switches the unit switch of $a_{33}$; and when the number of bits with the state "1" in the 7-bit second temperature code is 3, the 7-bit second temperature code controls and switches the unit switches of $a_{33}$, $a_{22}$, and $a_{77}$.

Further, in formula (2), $\theta$ is a gradient angle, and a gradient angle of the relative error of each unit current source is related to the craft and is uncontrollable. Therefore, in digital to analog converters adopting different solutions to control and switch unit switches of unit current sources, when the gradient angle is taken as a reference standard, the less sensitive to the gradient angle, the higher precision the digital to analog converter has.

Further, the unit errors $\Delta x$ and $\Delta y$ between unit current sources may be set according to specific experimental data.

Therefore, in digital to analog converters adopting different solutions to control and switch unit switches of unit current sources, when the unit errors are taken as a reference standard, the less sensitive to the unit errors, the higher precision the digital to analog converter has.

In order to compare more clearly degrees of sensitiveness of digital to analog converters, which adopt different solutions to control and switch unit switches of unit current sources, to the gradient angle of the linear gradient error and the unit errors $\Delta x$ and $\Delta y$, this embodiment takes that the digital electrical signal selected to be input into the digital to analog converter is an 8-bit binary digital signal as an example for description.

Figure 4:
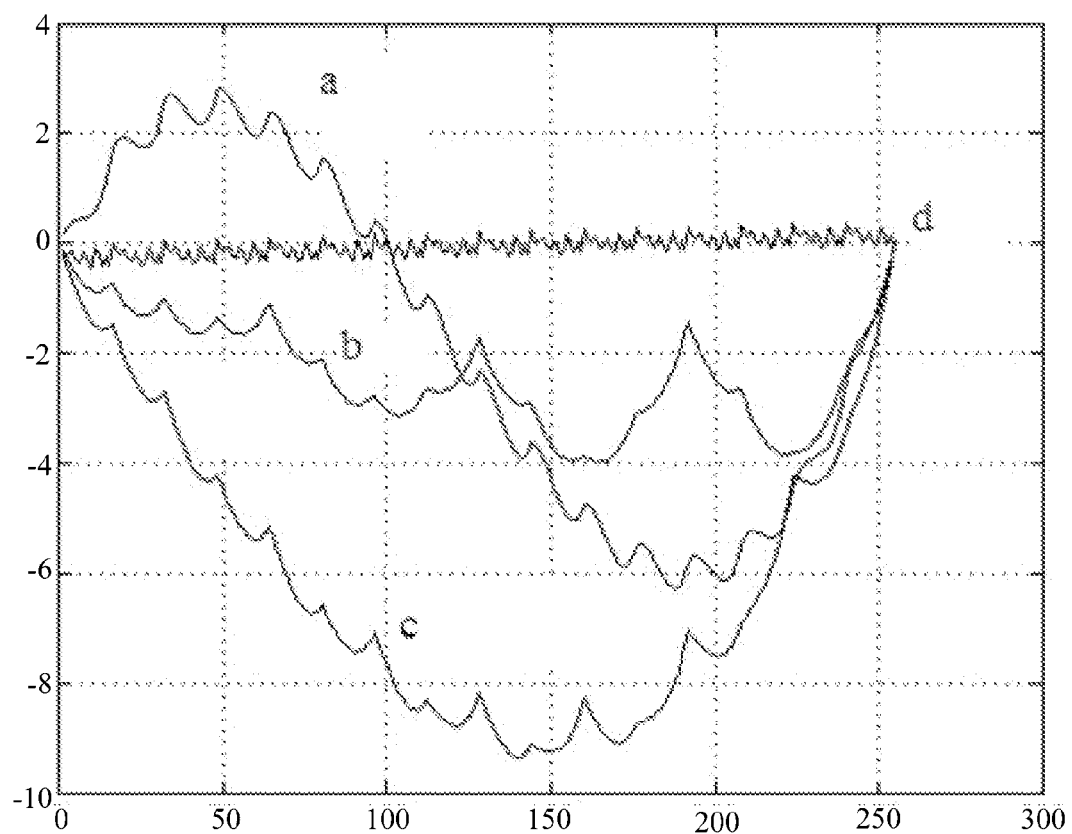
FIG. 4 is a contrastive diagram of system errors caused by different control methods when a gradient angle is 45 degrees, according to an embodiment of the present invention.
Figure 5:
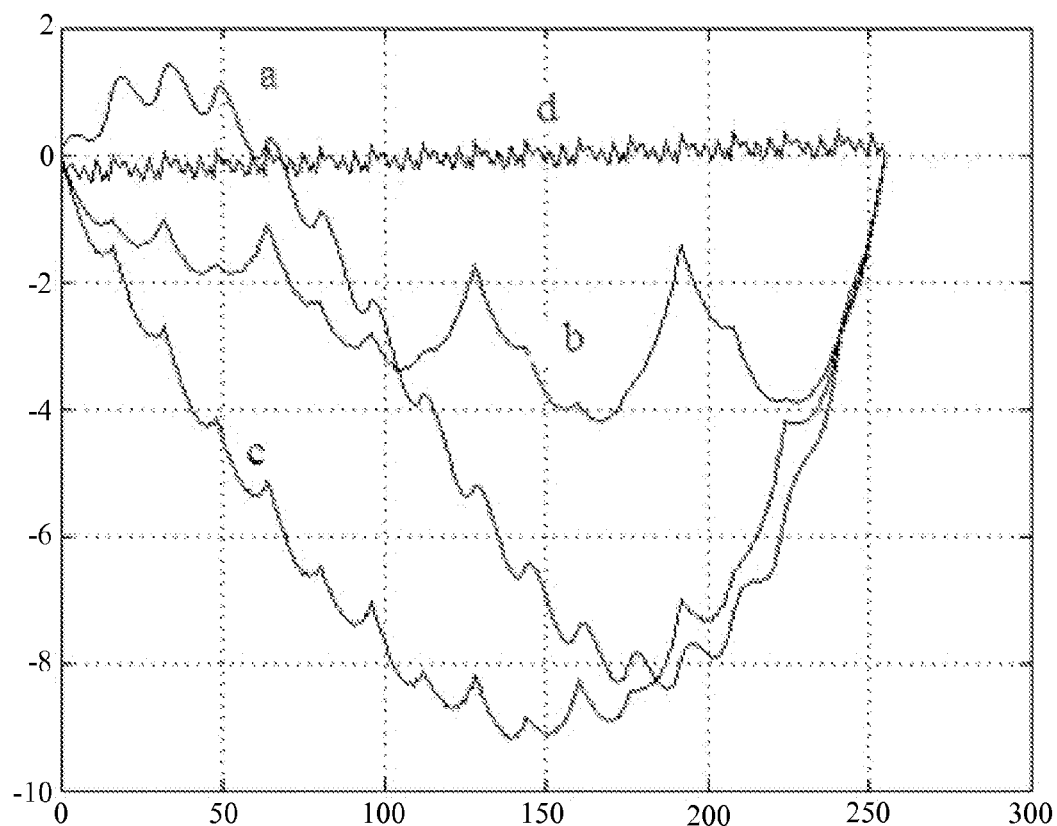
FIG. 5 is a contrastive diagram of system errors caused by different control methods when a gradient angle is 53 degrees, according to an embodiment of the present invention.

Refer to FIG. 4 and FIG. 5, which are contrastive schematic diagrams in which when the digital electrical signal input into a digital to analog converter is an 8-bit binary digital signal and the gradient angles of the linear relative error relative to the x axis are 45 degrees and 53 degrees, system errors of the digital to analog converter under different control solutions change as the 8-bit binary digital signal changes where a, b, and c are contrastive schematic diagrams in which system errors of digital to analog converters, which adopt a sequential method, a common symmetrical solution, and a layered symmetrical solution to control unit switches of unit current sources, change as the 8-bit binary digital signal changes, and d is a contrastive schematic diagram in which the system error of the digital to analog converter 100 provided in this solution changes as the 8-bit binary digital signal changes. It can be known from the figures that the digital to analog converter 100 provided in this solution is the least sensitive to the gradient angle.

Refer to FIG. 6, which is a contrastive schematic diagram in which when the digital electrical signal input into the digital to analog converter 100 is an 8-bit binary digital signal and the unit errors $\Delta x$ and $\Delta y$ are enlarged by ten times compared with FIG. 4 or FIG. 5, system errors of a digital to analog converter under different control solutions change as the 8-bit binary digital signal changes where a, b, and c are the contrastive schematic diagrams in which system errors of digital to analog converters, which adopt a sequential method, a common symmetrical solution and a layered symmetrical solution to control unit switches of unit current sources, change as the 8-bit binary digital signal changes, and d is a contrastive schematic diagram in which the system error of the digital to analog converter 100 provided in this solution changes as the 8-bit binary digital signal changes. It can be known from the figure that the digital to analog converter 100 provided in this solution is the least sensitive to the unit errors.

The degrees of sensitiveness of a digital to analog converter, which adopts the random turn-on control solution, to the gradient angle and the unit errors $\Delta x$ and $\Delta y$ between unit current sources is very close to a simulation result of the digital to analog converter 100 provided in this solution. However, subject to a defect of wiring difficulty, the random turn-on control solution is usually not adopted.

According to the digital to analog converter provided in this embodiment of the present invention, any bit of a $2^n-1$-bit first temperature code generated by using high n bits of an input 2n-bit binary digital signal is used to control and switch unit switches of all unit current sources on any one of $2^n-1$ first diagonals, and any bit of a $2^n-1$-bit second temperature code generated by using low n bits of the 2n-bit binary digital signal input into the digital to analog converter is used to control and switch a unit switch of any unit current source on the remaining second diagonal, so that control over a current source array in the digital to analog converter is implemented and a system error caused by the unit current sources controlled by the high n bits is reduced, thereby improving conversion precision of the digital to analog converter and solving a problem in the prior art that conversion precision of a digital to analog converter is not high.

The DAC in this embodiment may be implemented by a logic integrated circuit. For example, the DAC may be integrated on a substrate by using semiconductor craft.

In one aspect, refer to FIG. 7, which shows a method for controlling a current source array in a digital to analog converter according to an embodiment of the present invention, where the digital to analog converter includes a switch array and a current source array connected to the switch array. The switch array includes $2^n \times 2^n - 1$ unit switches that include $2^n \times (2^n-1)$ high-order unit switches and $2^n-1$ low-order unit switches; the current source array includes $2^n \times 2^n - 1$ unit current sources; each unit switch is configured to control an output of one unit current source; outputs of the $2^n \times 2^n - 1$ unit current sources are used to generate an output of the digital to analog converter; and n is a positive integer. The method includes the following steps:

Step 701: Generate a $2^n-1$-bit first temperature code by using high n bits of an input 2n-bit binary digital signal, and generate a $2^n-1$-bit second temperature code by using low n bits of the 2n-bit binary digital signal, where any bit of the $2^n-1$-bit first temperature code is used to control $2^n$ high-order unit switches, and any bit of the $2^n-1$-bit second temperature code is used to control one low-order unit switch.

Exemplarily, for conversion of a 2n-bit binary digital signal, a maximum numerical value after the conversion is $2^n \times 2^n - 1$. Therefore, under the method of the embodiment of the present invention, at least $2^n \times 2^n - 1$ unit current sources are arranged in the digital to analog converter, and $2^n \times 2^n - 1$ unit switches are arranged correspondingly, so as to control all unit current sources correspondingly in a one-to-one manner. Certainly, $2^n \times 2^n$ unit current sources and $2^n \times 2^n$ unit switches may also be arranged. That is to say, both the switch array and the current source array may be a $2^n \times 2^n$ matrix with one element missing, and may be a matrix including $2^n \times 2^n$ elements.

Step 702: Control, by using the $2^n-1$-bit first temperature code and the $2^n-1$-bit second temperature code, a working sequence of the $2^n \times 2^n - 1$ unit switches in the following manner: switching all unit switches on any one of $2^n-1$ first diagonals in a $2^n \times 2^n$ matrix formed by the $2^n \times 2^n - 1$ unit switches, where all elements on the $2^n-1$ first diagonals correspond to the $2^n \times (2^n-1)$ high-order unit switches; and switching all unit switches on a second diagonal except the $2^n-1$ first diagonals in the $2^n \times 2^n$ matrix according to a preset sequence, where $2^n-1$ elements on the second diagonal correspond to the $2^n-1$ low-order unit switches.

The following introduces the meaning of a diagonal in this embodiment of the present invention: for a $2^n \times 2^n$ matrix, it includes $2^n$ diagonals and specifically includes a middle diagonal and $2^n-1$ non-middle diagonals, where the middle diagonal and the non-middle diagonals are parallel to each other. The so-called middle diagonal may refer to a principal diagonal from the upper left to the lower right, or may refer to a secondary diagonal from the upper right to the lower left. The meaning of a non-middle diagonal is to be described in detail in the following by using a middle diagonal serving as a principal diagonal as an example.

Diagonals that are parallel to the principal diagonal and located on the upper right of the principal diagonal are successively called oblique line 1, oblique line 2, ..., oblique line i, ..., in ascending order, and diagonals that are located on the lower left of the principal diagonal are successively called oblique line (n-1)', oblique line (n-2)', ..., oblique line i', ..., in descending order. A combination of any oblique line i and oblique line i' is called a non-middle diagonal parallel to the principal diagonal. The number of elements passed through by two oblique lines which form the non-middle diagonal is the same as that of the principal diagonal. That is to say, the number of elements in the matrix that are passed through by any one of the diagonals is the same.

If the current source array is a $2^n \times 2^n$ matrix including $2^n \times 2^n$ elements, both the first diagonal and the second diagonal are any one of the foregoing diagonals, and each diagonal includes $2^n$ elements, where there are $2^n-1$ first diagonals and one second diagonal. In this embodiment of the present invention, because only $2^n \times 2^n - 1$ unit current sources function in the current source array, there will inevitably be one unit current source that does not function. Preferably, this unit current source that does not function is located on the second diagonal. Further, preferably, this unit current source that does not function is located at one of two ends of the second diagonal.

If the current source array is a $2^n \times 2^n$ matrix including $2^n \times 2^n - 1$ elements, the first diagonal is a diagonal that is among the foregoing diagonals and includes $2^n$ elements, and the second diagonal is a diagonal that is among the foregoing diagonals and includes $2^n-1$ elements. Preferably, the element missing from the $2^n \times 2^n$ matrix including $2^n \times 2^n - 1$ elements is located at one of two ends of the second diagonal.

The first diagonal and the second diagonal may also be defined by using the secondary diagonal of the $2^n \times 2^n$ matrix as a reference standard. A defining method is similar to the above, which is not described herein again.

Exemplarily, each unit switch is configured to control an output of one unit current source, and the switch array is configured to guide outputs of currents of unit current sources on the first diagonals under the control of the first temperature code, and guide outputs of currents of unit current sources on the second diagonal under the control of the second temperature code.

A unit switch may be a single-pole single-throw switch or a single-pole double-throw switch. When the unit switch is a single-pole single-throw switch, the switch array 20 may control guidance of outputs of currents of all unit current sources of the current source array 30 and use the sum of the currents of all unit current sources as an output of the digital to analog converter 100. When the unit switch is a single-pole double-throw switch, the switch array 20 may separately guide the currents output by the current source array 30 to a positive output terminal or a negative output terminal of the digital to analog converter. Either output terminal of the two output terminals may be used as the output of the digital to analog converter 100, or a difference between the two output terminals may be used as the output of the digital to analog converter 100. Certainly, the unit switch may include another type, and the output of the digital to analog converter 100 may also be implemented by using another method, which is not limited in this embodiment.

For a specific working principle and benefits of the method process, reference may be made to the descriptions of the previous apparatus embodiment, and no specific description is provided herein.

Similarly, an embodiment of the present invention provides another method for controlling a current source array in a digital to analog converter, where the method is used to control outputs of unit current sources included in the current source array, the current source array includes $2^n \times 2^n - 1$ unit current sources, and n is a positive integer. The method includes:

generating a $2^n-1$-bit first temperature code by using high n bits of an input 2n-bit binary digital signal, and generating a $2^n-1$-bit second temperature code by using low n bits of the 2n-bit binary digital signal, where any bit of the $2^n-1$-bit first temperature code is used to control $2^n$ high-order unit switches, and any bit of the $2^n-1$-bit second temperature code is used to control one low-order unit switch;

switching, by using the $2^n-1$-bit first temperature code, all unit switches on any one of $2^n-1$ first diagonals in a $2^n \times 2^n$ matrix formed by the $2^n \times 2^n-1$ unit switches, where all elements on the $2^n-1$ first diagonals correspond to the $2^n \times (2^n-1)$ high-order unit switches, so as to control outputs of unit current sources corresponding to the $2^n \times (2^n-1)$ high-order unit switches in the current source array; and switching all unit switches on a second diagonal except the $2^n-1$ first diagonals in the $2^n \times 2^n$ matrix according to a preset sequence and by using the $2^n-1$-bit second temperature code, where $2^n-1$ elements on the second diagonal correspond to the $2^n-1$ low-order unit switches, so as to control outputs of unit current sources corresponding to the $2^n-1$ low-order unit switches in the current source array.

Optionally, the first diagonals are non-middle diagonals, and the second diagonal is a middle diagonal.

Optionally, n is greater than or equal to 3, and the switching all unit switches on a second diagonal except the $2^n-1$ first diagonals in the $2^n \times 2^n$ matrix according to a preset sequence and by using the $2^n-1$-bit second temperature code includes: switching all unit switches on the middle diagonal in ascending order of distances away from two quartering points except the midpoint on the middle diagonal in the $2^n \times 2^n$ matrix by using the $2^n-1$-bit second temperature code, where the two quartering points are $2^{n-2}$ elements away from the midpoint.

Optionally, the switching all unit switches on the second diagonal in ascending order of distances away from two quartering points except the midpoint on the second diagonal in the $2^n \times 2^n$ matrix includes: firstly switching a unit switch which is a first distance away from one quartering point of the two quartering points, and then symmetrically switching a unit switch which is the first distance away from the other quartering point of the two quartering points.

According to the method for controlling a current source in a digital to analog converter provided in this embodiment of the present invention, any bit of a $2^n-1$-bit first temperature code generated by using high n bits of an input 2n-bit binary digital signal is used to control and switch unit switches of all unit current sources on any one of $2^n-1$ first diagonals, and any bit of a $2^n-1$-bit second temperature code generated by using low n bits of the 2n-bit binary digital signal input into the digital to analog converter is used to control and switch a unit switch of any unit current source on the remaining second diagonal, so that control over a current source array in the digital to analog converter is implemented and a system error caused by the unit current sources controlled by the high n bits is reduced, thereby improving conversion precision of the digital to analog converter and solving a problem in the prior art that conversion precision of a digital to analog converter is not high.

Persons of ordinary skill in the art may understand that all or a part of the steps of the foregoing method embodiments may be implemented by a program instructing relevant hardware. The foregoing program may be stored in a computer readable storage medium. When the program runs, the foregoing steps of the foregoing method embodiments are performed. The foregoing storage medium includes various media capable of storing program codes, such as a ROM, a RAM, a magnetic disk, or an optical disk.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims

What is claimed is:

1. A digital to analog converter, comprising: a decoding module, a switch array connected to the decoding module, and a current source array connected to the switch array, wherein:

the switch array comprises $2^n \times 2^n-1$ unit switches, which comprise $2^n \times (2^n-1)$ high-order unit switches and $2^n-1$ low-order unit switches;

the current source array comprises $2^n \times 2^n-1$ unit current sources;

each unit switch is configured to control an output of one unit current source; and outputs of the $2^n \times 2^n-1$ unit current sources are used to generate an output of the digital to analog converter;

the decoding module is configured to generate a $2^n-1$-bit first temperature code by using high n bits of an input 2n-bit binary digital signal, and generate a $2^n-1$-bit second temperature code by using low n bits of the 2n-bit binary digital signal, wherein any bit of the $2^n-1$-bit first temperature code is used to control $2^n$ high-order unit switches, and any bit of the $2^n-1$-bit second temperature code is used to control one low-order unit switch;

the decoding module is further configured to control, by using the $2^n-1$-bit first temperature code and the $2^n-1$-bit second temperature code, a working sequence of the $2^n \times 2^n-1$ unit switches in the following manner:

switching, by using the $2^n-1$-bit first temperature code, all unit switches on any one of $2^n-1$ first diagonals in a $2^n \times 2^n$ matrix formed by the $2^n \times 2^n-1$ unit switches, wherein all elements on the $2^n-1$ first diagonals correspond to the $2^n \times (2^n-1)$ high-order unit switches; and switching all unit switches on a second diagonal except the $2^n-1$ first diagonals in the $2^n \times 2^n$ matrix according to a preset sequence and by using the $2^n-1$-bit second temperature code, wherein $2^n-1$ elements on the second diagonal correspond to the $2^n-1$ low-order unit switches;

wherein n is a positive integer which is greater than or equal to 3, and the first diagonals are non-middle diagonals and the second diagonal is a middle diagonal; and switching all the unit switches on the second diagonal except the $2^n-1$ first diagonals in the $2^n \times 2^n$ matrix according to the preset sequence comprises: switching all the unit switches on the middle diagonal in ascending order of distances away from two quartering points except the midpoint on the middle diagonal in the $2^n \times 2^n$ matrix, wherein the two quartering points are $2^{n-2}$ elements away from the midpoint.

2. The digital to analog converter according to claim 1, wherein the switching all unit switches on the second diagonal in ascending order of distances away from two quartering points except the midpoint on the second diagonal in the $2^n \times 2^n$ matrix comprises:

firstly switching a unit switch which is a first distance away from one quartering point of the two quartering points, and then symmetrically switching a unit switch which is the first distance away from the other quartering point of the two quartering points.

3. The digital to analog converter according to claim 1, wherein the decoding module comprises:
a first decoder, configured to decode the high n bits of the 2n-bit binary digital signal to obtain the $2^n-1$-bit first temperature code;
a second decoder, configured to decode the low n bits of the 2n-bit binary digital signal to obtain the $2^n-1$-bit second temperature code; and
a control module, configured to control, by using the $2^n-1$-bit first temperature code and the $2^n-1$-bit second temperature code, the working sequence of the $2^n \times 2^n-1$ unit switches in the manner.

4. The digital to analog converter according to claim 3, wherein the control module is specifically configured to control, under the control of a software driver and by using the $2^n-1$-bit first temperature code and the $2^n-1$-bit second temperature code, the working sequence of the $2^n \times 2^n-1$ unit switches in the manner.

5. A method for controlling a current source array in a digital to analog converter, wherein the digital to analog converter comprises a switch array and a current source array connected to the switch array; the switch array comprises $2^n \times 2^n-1$ unit switches, which comprise $2^n \times (2^n-1)$ high-order unit switches and $2^n-1$ low-order unit switches; the current source array comprises $2^n \times 2^n-1$ unit current sources; each unit switch is configured to control an output of one unit current source; outputs of the $2^n \times 2^n-1$ unit current source are used to generate an output of the digital to analog converter; n is a positive integer which is greater than or equal to 3; and the method comprises:
generating a $2^n-1$-bit first temperature code by using high n bits of an input 2n-bit binary digital signal, and generating a $2^n-1$-bit second temperature code by using low n bits of the 2n-bit binary digital signal, wherein any bit of the $2^n-1$-bit first temperature code is used to control $2^n$ high-order unit switches, and any bit of the $2^n-1$-bit second temperature code is used to control one low-order unit switch; and
controlling, by using the $2^n-1$-bit first temperature code and the $2^n-1$-bit second temperature code, a working sequence of the $2^n \times 2^n-1$ unit switches in the following manner switching, by using the $2^n-1$-bit first temperature code, all unit switches on any one of $2^n-1$ first diagonals in a $2^n \times 2^n$ matrix formed by the $2^n \times 2^n-1$ unit switches, wherein all elements on the $2^n-1$ first diagonals correspond to the $2^n \times (2^n-1)$ high-order unit switches; and switching all unit switches on a second diagonal except the $2^n-1$ first diagonals in the $2^n \times 2^n$ matrix according to a preset sequence and by using the $2^n-1$-bit second temperature code, wherein $2^n-1$ elements on the second diagonal correspond to the $2^n-1$ low-order unit switches;
wherein the first diagonals are non-middle diagonals and the second diagonal is a middle diagonal; and
switching all the unit switches on the second diagonal except the $2^n-1$ first diagonals in the $2^n \times 2^n$ matrix according to the preset sequence comprises: switching all the unit switches on the middle diagonal in ascending order of distances away from two quartering points except the midpoint on the middle diagonal in the $2^n \times 2^n$ matrix, wherein the two quartering points are $2^{n-2}$ elements away from the midpoint.

6. The control method according to claim 5, wherein the switching all unit switches on the second diagonal in ascending order of distances away from two quartering points except the midpoint on the second diagonal in the $2^n \times 2^n$ matrix comprises:
firstly switching a unit switch which is a first distance away from one quartering point of the two quartering points, and then symmetrically switching a unit switch which is the first distance away from the other quartering point of the two quartering points.

7. A method for controlling a current source array in a digital to analog converter, used to control outputs of unit current sources comprised in the current source array, wherein the current source array comprises $2^n \times 2^n-1$ unit current sources, n is a positive integer which is greater than or equal to 3, and the method comprises:
generating a $2^n-1$-bit first temperature code by using high n bits of an input 2n-bit binary digital signal, and generating a $2^n-1$-bit second temperature code by using low n bits of the 2n-bit binary digital signal, wherein any bit of the $2^n-1$-bit first temperature code is used to control $2^n$ high-order unit switches, and any bit of the $2^n-1$-bit second temperature code is used to control one low-order unit switch;
switching, by using the $2^n-1$-bit first temperature code, all unit switches on any one of $2^n-1$ first diagonals in a $2^n \times 2^n$ matrix formed by the $2^n \times 2^n-1$ unit switches, wherein all elements on the $2^n-1$ first diagonals correspond to the $2^n \times (2^n-1)$ high-order unit switches, so as to control outputs of unit current sources corresponding to the $2^n \times (2^n-1)$ high-order unit switches in the current source array; and
switching all unit switches on a second diagonal except the $2^n-1$ first diagonals in the $2^n \times 2^n$ matrix according to a preset sequence and by using the $2^n-1$-bit second temperature code, wherein $2^n-1$ elements on the second diagonal correspond to the $2^n-1$ low-order unit switches, so as to control outputs of unit current sources corresponding to the $2^n-1$ low-order unit switches in the current source array;
wherein the first diagonals are non-middle diagonals and the second diagonal is a middle diagonal; and
switching all the unit switches on the second diagonal except the $2^n-1$ first diagonals in the $2^n \times 2^n$ matrix according to the preset sequence comprises: switching all the unit switches on the middle diagonal in ascending order of distances away from two quartering points except the midpoint on the middle diagonal in the $2^n \times 2^n$ matrix, wherein the two quartering points are $2^{n-2}$ elements away from the midpoint.

8. The control method according to claim 7, wherein the switching all unit switches on the second diagonal in ascending order of distances away from two quartering points except the midpoint on the second diagonal in the $2^n \times 2^n$ matrix comprises:
firstly switching a unit switch which is a first distance away from one quartering point of the two quartering points, and then symmetrically switching a unit switch which is the first distance away from the other quartering point of the two quartering points.

* * * * *